(12) United States Patent
Lin et al.

(10) Patent No.: US 10,217,854 B1
(45) Date of Patent: Feb. 26, 2019

(54) SEMICONDUCTOR DEVICE AND METHOD OF MANUFACTURING THE SAME

(71) Applicant: Vanguard International Semiconductor Corporation, Hsinchu (TW)

(72) Inventors: Yung-Hao Lin, Jhunan Township (TW); Shin-Cheng Lin, Tainan (TW); Hsin-Chih Lin, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/720,120

(22) Filed: Sep. 29, 2017

(51) Int. Cl.
*H01L 29/20* (2006.01)
*H01L 29/778* (2006.01)
*H01L 29/205* (2006.01)
*H01L 29/66* (2006.01)
*H01L 29/78* (2006.01)

(52) U.S. Cl.
CPC ...... *H01L 29/7783* (2013.01); *H01L 29/2003* (2013.01); *H01L 29/205* (2013.01); *H01L 29/66462* (2013.01); *H01L 29/66477* (2013.01); *H01L 29/78* (2013.01)

(58) Field of Classification Search
CPC ............. H01L 29/7783; H01L 29/2003; H01L 29/66462; H01L 29/66477; H01L 29/78; H01L 29/205
See application file for complete search history.

(56) References Cited

U.S. PATENT DOCUMENTS

| 8,455,920 B2* | 6/2013 | Bridger | H01L 29/0692 257/194 |
| 2014/0110759 A1* | 4/2014 | Murata | H01L 29/7783 257/194 |
| 2014/0264273 A1 | 9/2014 | Howell et al. | |

FOREIGN PATENT DOCUMENTS

TW        557567 B      10/2003

\* cited by examiner

*Primary Examiner* — Jose R Diaz
(74) *Attorney, Agent, or Firm* — Birch, Stewart, Kolasch & Birch, LLP

(57) ABSTRACT

The embodiments of the present disclosure provide a semiconductor device. The semiconductor device includes a first III-V compound layer disposed over a substrate and a second III-V compound layer disposed over the first III-V compound layer, wherein a first carrier channel is formed in the interface between the first III-V compound layer and the second III-V compound layer. The semiconductor device also includes a third III-V compound layer disposed over the second III-V compound layer and a fourth III-V compound layer disposed over the third III-V compound layer, wherein a second carrier channel is formed in an interface between the third III-V compound layer and the fourth III-V compound layer. The semiconductor device includes a gate structure and S/D regions disposed on two opposite sides of the gate structure, wherein the first carrier channel and the second carrier channel are extended between the S/D regions.

20 Claims, 5 Drawing Sheets

SEMICONDUCTOR DEVICE AND METHOD OF MANUFACTURING THE SAME

BACKGROUND OF THE INVENTION

Field of the Invention

The present invention relates to a semiconductor device and a method of manufacturing the same, and in particular to a semiconductor device having multiple channels.

Description of the Related Art

In recent years, the development of semiconductor devices for use in computers, consumer electronics, and other fields has progressed rapidly. Currently, semiconductor device technology has been widely accepted in Metal-Oxide-Semiconductor Field-Effect Transistor (MOSFET) products that are marketed with a high market share.

Gallium nitride on silicon (GaN-on-Si) based devices have become an attractive option for power devices over the past few years. Gallium nitride transistor devices provide for a high electron mobility in a two-dimensional electron gas (2DEG) located near the interface of a AlGaN and a GaN heterostructure interface. The high electron mobility provides for a good power gain at high frequencies used in radio frequency (RF) applications.

However, existing semiconductor devices have not been satisfactory in every respect. Therefore, it is necessary to find a new high-voltage semiconductor device structure to solve the above problems.

BRIEF SUMMARY OF THE INVENTION

The disclosure provides a semiconductor device. The semiconductor device includes a substrate and a first III-V compound layer disposed over the substrate. The semiconductor device also includes a second III-V compound layer disposed over the first III-V compound layer. A first carrier channel is formed in the interface between the first III-V compound layer and the second III-V compound layer. The semiconductor device further includes a third III-V compound layer disposed over the second III-V compound layer and a fourth III-V compound layer disposed over the third III-V compound layer. A second carrier channel is formed in an interface between the third III-V compound layer and the fourth III-V compound layer. In addition, the semiconductor device includes a gate structure disposed over the fourth III-V compound layer. The semiconductor device also includes a source region and a drain region disposed on two opposite sides of the gate structure, wherein the first carrier channel and the second carrier channel are extended between the source region and the drain region.

The disclosure provides a method for manufacturing a semiconductor device. The method includes providing a substrate and forming a first III-V compound layer in the substrate. The method also includes forming a second III-V compound layer over the first III-V compound layer so that a first carrier channel is formed between the first III-V compound layer and the second III-V compound layer. The method further includes forming a third III-V compound layer over the second III-V compound layer and forming a fourth III-V compound layer over the third III-V compound layer so that a second carrier channel is formed between the third III-V compound layer and the fourth III-V compound layer. In addition, the method includes forming a gate structure over the fourth III-V compound layer. The method also includes forming a source region and a second region on two opposite sides of the gate structure and the source region and the drain region penetrate the fourth III-V compound layer, the third III-V compound layer, and the second III-V compound layer, wherein the first carrier channel and the second carrier channel are extended between the source region and the drain region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
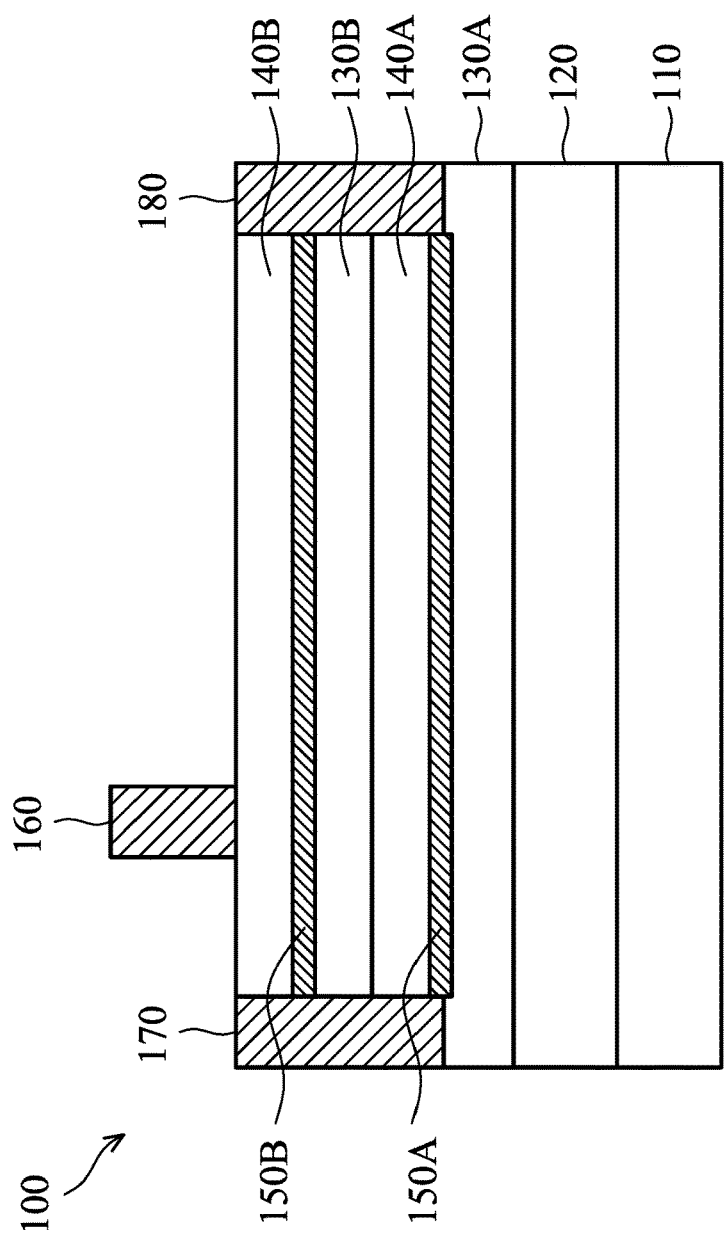
FIG. 1 is a cross-sectional view of a semiconductor device in accordance with some embodiments.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should also be noted that the present disclosure presents embodiments of a semiconductor device, and may be included in an integrated circuit (IC) such as a microprocessor, memory device, and/or other device. The IC may also include various passive and active microelectronic devices, such as thin film resistors, other capacitor (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

Referring to FIG. 1, FIG. 1 is a cross-sectional view of a semiconductor device 100 in accordance with some embodiments. As shown in FIG. 1, the semiconductor device 100 includes a substrate 110. The substrate 110 may include, but is not limited to, semiconductor substrate such as a silicon substrate. In addition, the substrate 110 may include an element semiconductor which may include germanium; compound semiconductor which may include silicon carbide, gallium arsenide, gallium phosphide, indium phosphide, indium arsenide and/or indium antimonide; alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 110 may include semiconductor-on-insulator. In addition, the substrate 110 may include an epitaxial layer (not shown). For example, the substrate 110 may have an epitaxial layer overlying a bulk semiconductor. Furthermore, the substrate 110 may include a semiconductor-on-insulator (SOI) structure. For example, the substrate 110 may include a buried oxide (BOX) layer formed by a process such as separation by implanted oxygen (SIMOX), or another suitable technique such as wafer bonding and grinding.

As shown in FIG. 1, the semiconductor device 100 also includes a buffer layer 120. In some embodiments, the buffer layer 120 is disposed over the substrate 110. The buffer layer 120 is used to reduce strain between the substrate 110 and the subsequently formed III-V compound layer. In some embodiments, the buffer layer 120 includes an AlN nucleation layer, an AlGaN layer or a combination thereof. The buffer layer 120 is also used to reduce the defect due to the dislocation between the substrate 110 and the subsequently formed III-V compound layer. In some embodiments, the thickness of the buffer layer 120 is between about 0.5 μm and about 2 μm.

As shown on FIG. 1, the semiconductor device 100 also includes a first III-V compound layer 130A and a second III-V compound layer 140A formed over the first III-V compound layer 130A. In some embodiments, the first III-V compound layer 130A and the second III-V compound layer 140A are material layers with different band gaps. In some embodiments, the first III-V compound layer 130A and the second III-V compound layer 140A are compounds made from the III-V groups in the periodic table of elements. However, the first III-V compound layer 130A and the second III-V compound layer 140A are different from each other in composition. In some embodiments, the first III-V compound layer 130A includes a gallium nitride (GaN) layer. The second III-V compound layer 140A includes an aluminum gallium nitride layer (also referred to as $Al_xGa_{1-x}N$ layer, wherein 0<x<1). The first III-V compound layer 130A and the second III-V compound layer 140A are in direct contact with each other. Since the first III-V compound layer 130A and the second III-V compound layer 140A have different band gaps, a heterojunction is formed in the interface between the first III-V compound layer 130A and the second III-V compound layer 140A.

The first III-V compound layer 130A can be epitaxially grown by metal organic vapor phase epitaxy (MOVPE) using a gallium-containing precursor and a nitrogen-containing precursor. The gallium-containing precursor includes trimethylgallium (TMG), triethylgallium (TEG), or another suitable chemical. The nitrogen-containing precursor includes ammonia ($NH_3$), tertiarybutylamine (TBA), phenyl hydrazine, or another suitable chemical. In some embodiments, the first III-V compound layer 130A has a thickness ranging from about 0.5 µm to about 2 µm.

As shown in FIG. 1, the second III-V compound layer 140A is epitaxially grown on the first III-V compound layer 130A. The second III-V compound layer 140A can be epitaxially grown by MOVPE using an aluminum-containing precursor, a gallium-containing precursor, and a nitrogen-containing precursor. The aluminum-containing precursor includes trimethtylaluminum (TMA), triethylaluminum (TEA), or another suitable chemical. The gallium-containing precursor includes TMG, TEG, or another suitable chemical. The nitrogen-containing precursor includes ammonia, TBA, phenyl hydrazine, or another suitable chemical. In some embodiments, the second III-V compound layer 140A has a thickness ranging from about 5 µm to about 50 µm.

The band gap discontinuity between the second III-V compound layer 140A and the first III-V compound layer 130A, along with the piezo-electric effect, creates a first carrier channel 150A of highly mobile conducting electrons at an interface between the second III-V compound layer 140A and the first III-V compound layer 130A. The first carrier channel 150A is referred to as a two-dimensional electron gas (2-DEG), forming a carrier channel at the interface between the second III-V compound layer 140A and the first III-V compound layer 130A.

In some embodiments, as shown in FIG. 1, the semiconductor device 100 further includes a third III-V compound layer 130B and a fourth III-V compound layer 140B. As shown in FIG. 1, the third III-V compound layer 130B is formed over the second III-V compound layer 140A, and the fourth III-V compound layer 140B is formed over the third III-V compound layer 130B. In some embodiments, the third III-V compound layer 130B includes a GaN layer, and the fourth III-V compound layer 140B includes an $Al_xGa_{1-x}N$ layer, wherein 0<x<1. The third III-V compound layer 130B and the fourth III-V compound layer 140B may be in direct contact with each other. The formation process and the material of the third III-V compound layer 130B and the fourth III-V compound layer 140B may be similar to the formation of the first III-V compound layer 130A and the second III-V compound layer 140A, respectively, and the details of the formation process are not repeated herein.

In this embodiment, the band gap discontinuity between the fourth III-V compound layer 140B and the third III-V compound layer 130B, along with the piezo-electric effect, creates a second carrier channel 150B of highly mobile conducting electrons at an interface between the fourth III-V compound layer 140B and the third III-V compound layer 130B. The second carrier channel 150B is also referred to as a two-dimensional electron gas, forming a carrier channel at the interface between the fourth III-V compound layer 140B and the third III-V compound layer 130B. It should be noted that there is also a heterojunction formed in an interface between the third III-V compound layer 130B and the second III-V compound layer 140A. However, there is no carrier channel formed at the interface between the third III-V compound layer 130B and the second III-V compound layer 140A due to the polarization direction caused by piezo-electric effect, but the carrier channels are formed at the interface between the first III-V compound layer 130A and the second III-V compound layer 140A and at the interface between the third III-V compound layer 130B and the fourth III-V compound layer 140B.

As shown in FIG. 1, the semiconductor device 100 also includes a gate structure 160, a source region 170 and a drain region 180. The source region 170 and the drain region 180 are formed on two opposite sides of the gate structure 160. The source region 170 and the drain region 180 include one or more conductive materials. For example, the source region 170 and the drain region 180 include metals selected from the group consisting of titanium, aluminum, nickel, and gold. The source region 170 and the drain region 180 can be formed by a process such as physical vapor deposition (PVD), chemical vapor deposition (CVD), atomic layer deposition (ALD), coating, sputtering or other proper technique. In this embodiment, the first carrier channel 150A and the second carrier channel 150B are extended between the source region 170 and the drain region 180. In addition, the source region 170 and the drain region 180 may penetrate the second III-V compound layer 140A, the third III-V compound layer 130B and the fourth III-V compound layer 140B.

As shown in FIG. 1, the gate structure 160 is formed over the substrate 110, and over the fourth III-V compound layer 140B. The gate structure 160 may include a gate electrode layer (not shown) and a gate dielectric layer (not shown). The gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate electrode includes one or more layer of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In some embodiments, the component of the second III-V compound layer 140A is the same as that of the fourth III-V compound layer 140B. In other embodiments, the component of the second III-V compound layer 140A is different from that of the fourth III-V compound layer 140B. For example, the weight percentage of aluminum of the second III-V compound layer 140A is greater than that of the fourth III-V compound layer 140B. In other embodiments, the weight percentage of aluminum of the second III-V compound layer 140A is smaller than that of the fourth III-V compound layer 140B.

Figure 2A:
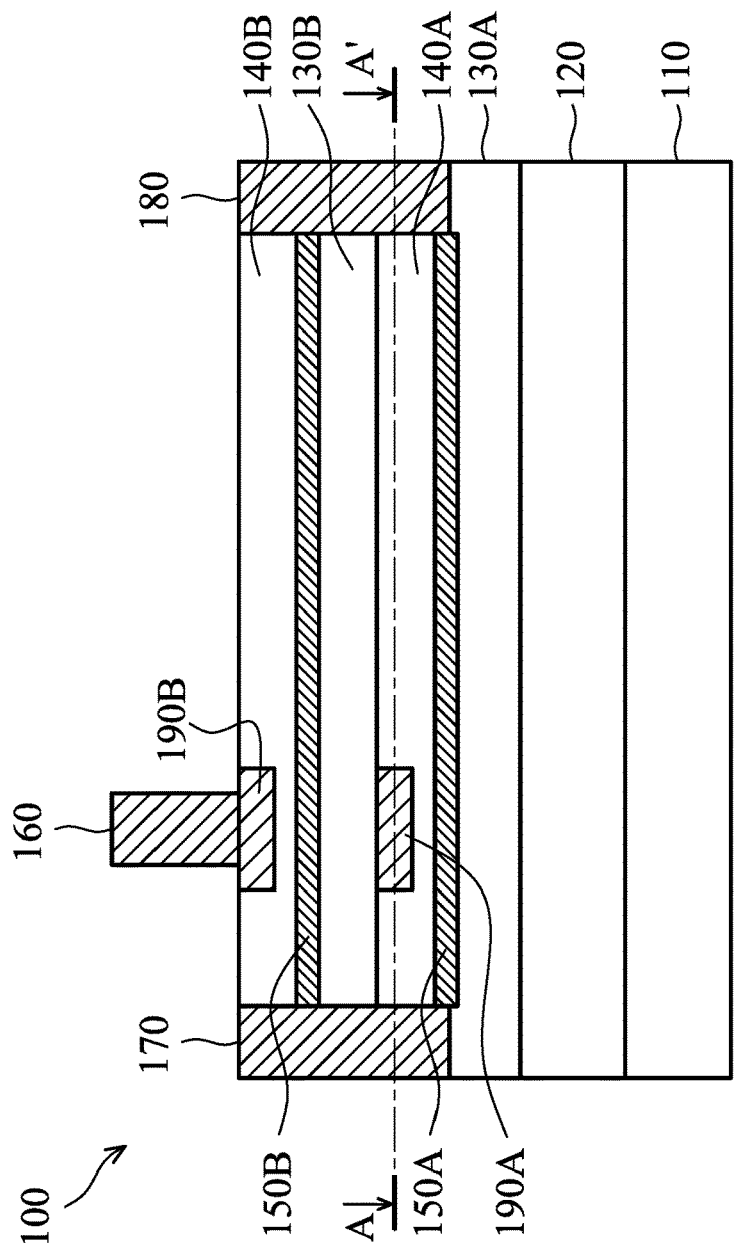
FIG. 2A is a cross-sectional view of a semiconductor device in accordance with some embodiments.

Referring FIG. 2A, FIG. 2A is a cross-sectional view of a semiconductor device 100 in accordance with some embodiments. In some embodiments, as shown in FIG. 2A, the semiconductor device 100 further includes a first extended electrode 190A and a second extended electrode 190B. In some embodiments, the first extended electrode 190A is formed in the second III-V compound layer 140A and surrounded by the second III-V compound layer 140A. In some embodiments, the second extended electrode 190B is formed in the fourth III-V compound layer 140B and surrounded by the fourth III-V compound layer 140B. In some embodiments, as shown in FIG. 2A, a portion of the second III-V compound layer 140A is located between the first extended electrode 190A and the first III-V compound layer 130A, and a portion of the fourth III-V compound layer 140B is located between the second extended electrode 190B and the third III-V compound layer 130B. In addition, as shown in FIG. 2A, In some embodiments, the first extended electrode 190A and the second extended electrode 190B are located directly under the gate structure 160. In some embodiments, the thickness of the first extended electrode 190A and the second extended electrode 190B are between about 20 nm and about 100 nm.

The first extended electrode 190A and the second extended electrode 190B are electrically connected to the gate structure 160, and are used as the switches of the first carrier channel 150A and the second carrier channel 150B, respectively. In some embodiments, the first extended electrode 190A and the second extended electrode 190B include p-type III-V compound or metal. In some embodiments, the p-type III-V compound includes p-type gallium nitride or other suitable material. Metal includes gold, platinum, rhodium, iridium, titanium, aluminum, copper, tantalum, tungsten, alloys or other suitable materials. In some embodiments, the first extended electrode 190A and the second extended electrode 190B are embedded in the second III-V compound layer 140A and the fourth III-V compound layer 140B, respectively.

Figure 2B:
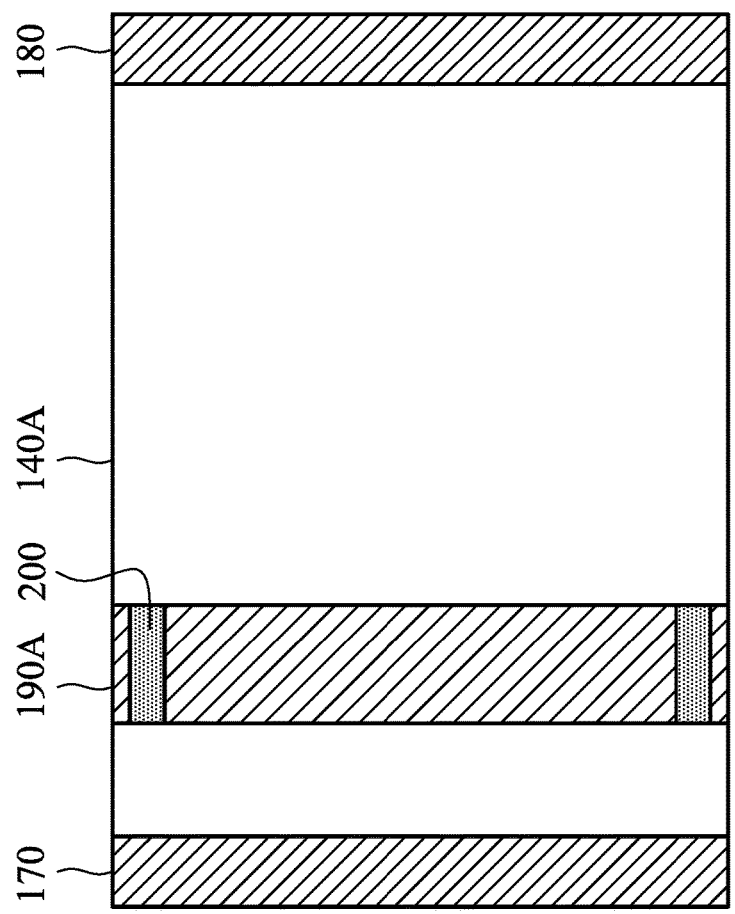
FIG. 2B is a cross-sectional view along line A-A' of the semiconductor device shown in FIG. 2A in accordance with some embodiments.

Referring to FIG. 2B, FIG. 2B is a cross-sectional view along line A-A' of the semiconductor device 100 shown in FIG. 2A in accordance with some embodiments. As shown in FIG. 2B, the semiconductor device 100 further includes conductive wires 200. The conductive wires 200 are configured to be electrically connected to the first extended electrode 190A, the second extended electrode 190B and the gate structure 160. The conductive wires 200 are formed in the substrate 110, and penetrate through the second III-V compound layer 140A, the third III-V compound layer 130B and the fourth III-V compound layer 140B to connect the first extended electrode 190A, the second extended electrode 190B and the gate structure 160. The conductive wires 200 may include gold, platinum, rhodium, iridium, titanium, aluminum, copper, tantalum, tungsten, alloys or other suitable materials.

Figure 3:
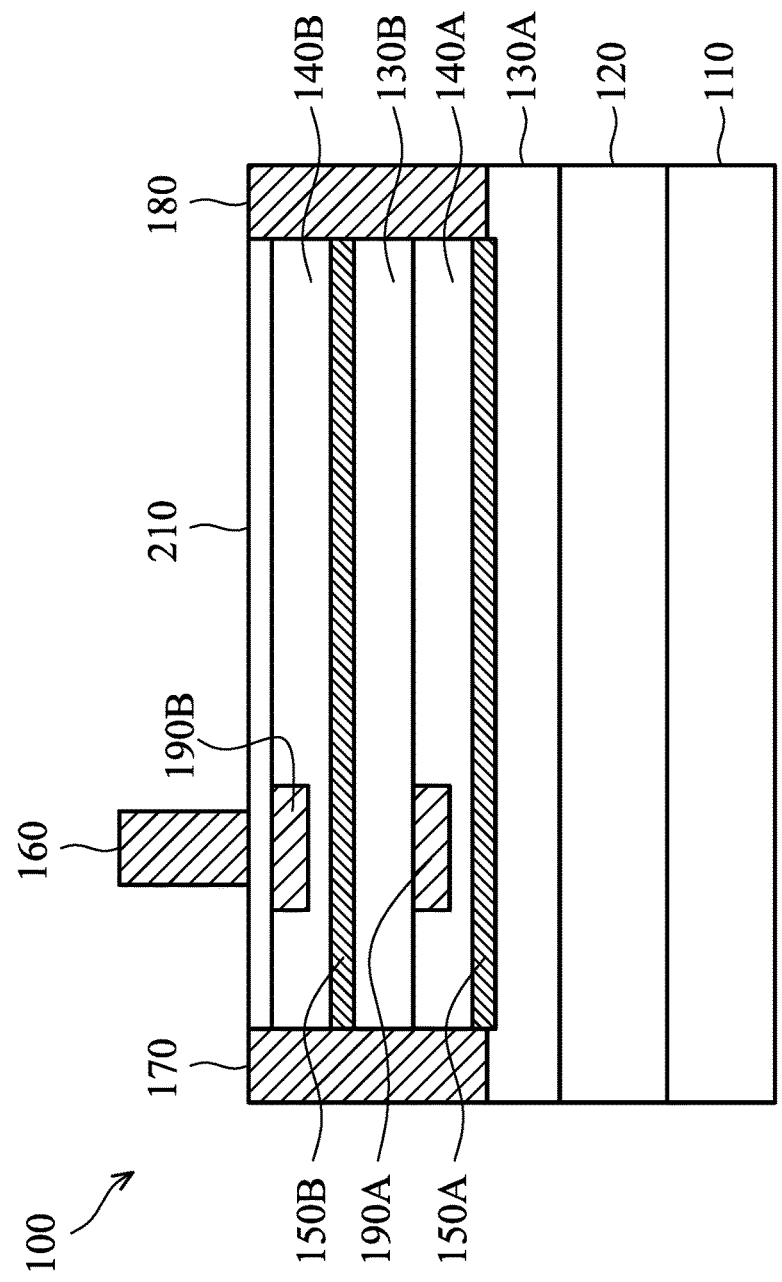
FIG. 3 is a cross-sectional view of a semiconductor device in accordance with some embodiments.

Referring to FIG. 3, FIG. 3 is a cross-sectional view of a semiconductor device 100 in accordance with some embodiments. In some embodiments, the semiconductor device 100 further includes a protective layer 210. In some embodiments, the protective layer 210 is formed on the surface of the fourth III-V compound layer 140B. The protective layer 210 is configured to reduce the defect on the surface of the fourth III-V compound layer 140B (such as $Al_xGa_{1-x}N$). In some embodiments, the protective layer 210 includes GaN, SiN or other suitable materials. The thickness of the protective layer 210 is between about 10 nm and about 100 nm.

Figure 4:
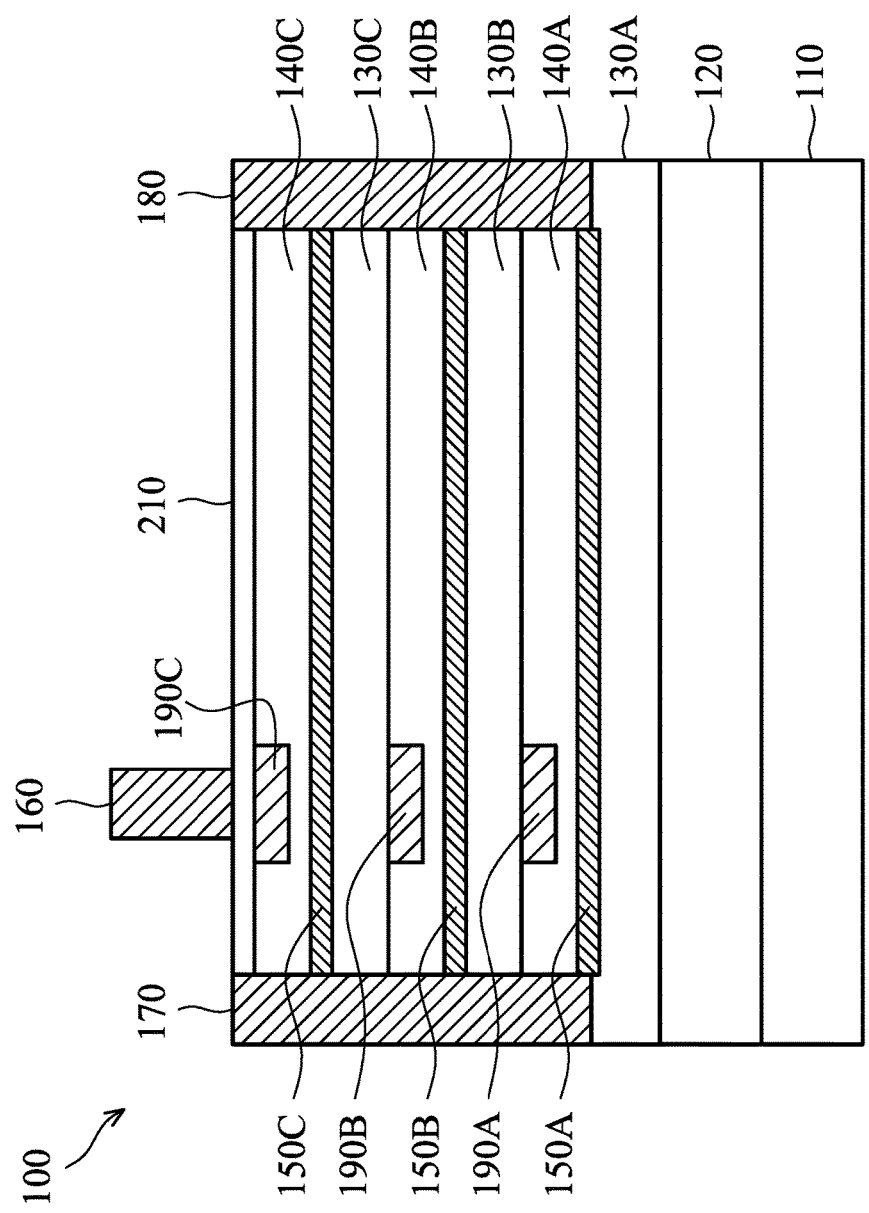
FIG. 4 is a cross-sectional view of a semiconductor device in accordance with some embodiments.

Referring to FIG. 4, FIG. 4 is a cross-sectional view of a semiconductor device 100 in accordance with some embodiments. In some embodiments, as shown in FIG. 4, the semiconductor device 100 further includes a fifth III-V compound layer 130C, a sixth III-V compound layer 140C and a third extended electrode 190C. As shown in FIG. 4, the fifth III-V compound layer 130C is formed over the fourth III-V compound layer 140B, and the sixth III-V compound layer 140C is formed over the fifth III-V compound layer 130C. In some embodiments, the fifth III-V compound layer 130C includes a GaN layer, and the sixth III-V compound layer 140C includes an $Al_xGa_{1-x}N$ layer, wherein $0<x<1$. The fifth III-V compound layer 130C and the sixth III-V compound layer 140C may be in direct contact with each other. The formation process and the material of the fifth III-V compound layer 130C and the sixth III-V compound layer 140C may be similar to the formation of the first III-V compound layer 130A and the second III-V compound layer 140A, respectively, and the details of the formation process are not repeated herein.

In this embodiment, a third carrier channel 150C is formed at an interface between the sixth III-V compound layer 140C and the fifth III-V compound layer 130C. The third carrier channel 150C is also referred to as a two-dimensional electron gas, forming a carrier channel at the interface between the sixth III-V compound layer 140C and the fifth III-V compound layer 130C. It should be noted that there is also a heterojunction formed in an interface between the fifth III-V compound layer 130C and the fourth III-V compound layer 140B. However, there is no carrier channel formed at the interface between the fifth III-V compound layer 130C and the fourth III-V compound layer 140B due to the polarization direction caused by piezo-electric effect, but the carrier channel is formed at the interface between the fifth III-V compound layer 130C and the sixth III-V compound layer 140C.

The switch of the third carrier channel 150C is controlled by the third extended electrode 190C. The material of the third extended electrode 190C may be similar to the formation of the first extended electrode 190A or the second extended electrode 190B, respectively, and the details of the formation process are not repeated herein.

The embodiments of the disclosure provide semiconductor devices with multiple III-V compound layers so that multiple carrier channels are formed. In addition, each of the carrier channel is switched by each of the corresponding extended electrode, respectively. Moreover, the embodiments of the disclosure can form more carrier channels to improve the performance of the semiconductor device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a first III-V compound layer disposed over the substrate;
a second III-V compound layer disposed over the first III-V compound layer, wherein a first carrier channel is formed in an interface between the first III-V compound layer and the second III-V compound layer;
a third III-V compound layer disposed over the second III-V compound layer;
a fourth III-V compound layer disposed over the third III-V compound layer, wherein a second carrier channel is formed in an interface between the third III-V compound layer and the fourth III-V compound layer;
a gate structure disposed over the fourth III-V compound layer;

a source region and a drain region disposed on two opposite sides of the gate structure, wherein the first carrier channel and the second carrier channel are extended between the source region and the drain region; and a first extended electrode disposed between the second III-V compound layer and the third III-V compound layer.

2. The semiconductor device as claimed in claim 1, wherein the first III-V compound layer and the third III-V compound layer comprise GaN, the second III-V compound layer and the fourth III-V compound layer comprise $Al_xGa_{1-x}N$, and $0<x<1$.

3. The semiconductor device as claimed in claim 2, wherein a composition of the second III-V compound layer is the same as that of the fourth III-V compound layer.

4. The semiconductor device as claimed in claim 2, wherein a composition of the second III-V compound layer is different from that of the fourth III-V compound layer.

5. The semiconductor device as claimed in claim 1, further comprising:

a second extended electrode disposed between the fourth III-V compound layer and the gate structure, wherein the first extended electrode and the second electrode are electrically connected to the gate structure.

6. The semiconductor device as claimed in claim 5, wherein the first extended electrode and the second extended electrode comprise a p-type doped III-V compound or a metal.

7. The semiconductor device as claimed in claim 6, wherein the first extended electrode and the second extended electrode comprise a p-type doped GaN.

8. The semiconductor device as claimed in claim 5, further comprising:

a conductive wire disposed in the substrate, and electrically connected to the first extended electrode, the second extended electrode and the gate structure.

9. The semiconductor device as claimed in claim 5, wherein the first extended electrode and the second extended electrode are located directly under the gate structure.

10. The semiconductor device as claimed in claim 5, wherein the first extended electrode is surrounded by the second III-V compound layer, and the second extended electrode is surrounded by the fourth III-V compound layer.

11. The semiconductor device as claimed in claim 5, wherein a portion of the fourth III-V compound layer is disposed between the second extended electrode and the third III-V compound layer, and a portion of the second III-V compound layer is disposed between the first extended electrode and the first III-V compound layer.

12. The semiconductor device as claimed in claim 5, further comprising:

a protective layer disposed on a surface of the fourth III-V compound layer, wherein the protective layer comprises GaN or SiN.

13. The semiconductor device as claimed in claim 5, wherein there is no carrier channel formed between the second III-V compound layer and the third III-V compound layer.

14. A method for forming a semiconductor device, comprising:

providing a substrate;

forming a first III-V compound layer in the substrate;

forming a second III-V compound layer over the first III-V compound layer so that a first carrier channel is formed in an interface between the first III-V compound layer and the second III-V compound layer;

forming a third III-V compound layer over the second III-V compound layer;

forming a first extended electrode between the second III-V compound layer and the third III-V compound layer;

forming a fourth III-V compound layer over the third III-V compound layer so that a second carrier channel is formed in an interface between the third III-V compound layer and the fourth III-V compound layer;

forming a gate structure over the fourth III-V compound layer; and forming a source region and a second region on two opposite sides of the gate structure, and the source region and the drain region penetrate the fourth III-V compound layer, the third III-V compound layer, and the second III-V compound layer, wherein the first carrier channel and the second carrier channel are extended between the source region and the drain region.

15. The method as claimed in claim 14, wherein the first III-V compound layer and the third III-V compound layer comprise GaN, the second III-V compound layer and the fourth III-V compound layer comprise $Al_xGa_{1-x}N$, and $0<x<1$.

16. The method as claimed in claim 14, further comprising:

forming a second extended electrode between the fourth III-V compound layer and the gate structure, wherein the first extended electrode and the second extended electrode are electrically connected to the gate structure, and the first extended electrode and the second extended electrode comprise a p-type doped III-V compound or a metal.

17. The method as claimed in claim 16, wherein the first extended electrode and the second extended electrode comprise a p-type doped GaN.

18. The method as claimed in claim 16, further comprising:

forming a conductive wire in the substrate so that the first extended electrode and the second extended electrode are electrically connected to the gate structure.

19. The method as claimed in claim 14, further comprising:

forming a protective layer on a surface of the fourth III-V compound layer, wherein the protective layer comprises GaN or SiN.

20. The method as claimed in claim 14, wherein there is no carrier channel formed between the second III-V compound layer and the third III-V compound layer.

* * * * *